(12) United States Patent
Matsumura et al.

(10) Patent No.: US 12,456,566 B2
(45) Date of Patent: *Oct. 28, 2025

(54) CRYOCOOLER AND MAGNETIC SHIELD

(71) Applicant: SUMITOMO HEAVY INDUSTRIES, LTD., Tokyo (JP)

(72) Inventors: Yosuke Matsumura, Nishitokyo (JP); Takaaki Morie, Yokosuka (JP); Jun Yoshida, Yokosuka (JP)

(73) Assignee: SUM ITOMO HEAVY INDUSTRIES, LTD., Tokyo (JP)

( * ) Notice: Subject to any disclaimer, the term of this patent is extended or adjusted under 35 U.S.C. 154(b) by 598 days.

This patent is subject to a terminal disclaimer.

(21) Appl. No.: 17/683,358

(22) Filed: Mar. 1, 2022

(65) Prior Publication Data

US 2022/0270796 A1    Aug. 25, 2022

Related U.S. Application Data

(63) Continuation of application No. 16/584,938, filed on Sep. 26, 2019, now Pat. No. 11,342,100, which is a
(Continued)

(30) Foreign Application Priority Data

Mar. 30, 2017 (JP) ................................ 2017-068412

(51) Int. Cl.
*F25B 9/14* (2006.01)
*F25B 9/00* (2006.01)
(Continued)

(52) U.S. Cl.
CPC ............... *H01F 6/04* (2013.01); *F25B 9/002* (2013.01); *F25B 9/10* (2013.01); *F25B 9/145* (2013.01);
(Continued)

(58) Field of Classification Search
CPC ...... F25B 9/14; F25B 9/145; F25B 2309/001; F25D 19/006; G01R 33/3815; G01R 33/3804; G01R 33/4215
See application file for complete search history.

(56) References Cited

U.S. PATENT DOCUMENTS 5,081,071 A * 1/1992 Hirschkoff ........... H05K 9/0001
                                                    600/409
7,323,963 B2 * 1/2008 Nemoto ............. G01R 33/3815
                                                    62/51.1
(Continued)

FOREIGN PATENT DOCUMENTS

| JP | 2001-263844 A | 9/2001 |
| JP | 2009-293909 A | 12/2009 |
| JP | 2013-38262 A | 2/2013 |

*Primary Examiner* — Brian M King
(74) *Attorney, Agent, or Firm* — HEA Law PLLC

(57) ABSTRACT

A cryocooler includes a second-stage cooling stage, a second cylinder which includes the second-stage cooling stage on a terminal of the second-stage cylinder, a second-stage displacer which includes a magnetic regenerator material and is accommodated in the second-stage cylinder so as to be able to reciprocate in the second-stage cylinder, and a tubular magnetic shield which is installed on the second-stage cooling stage and extends along the second-stage cylinder outside the second-stage cylinder. The magnetic shield is formed of a normal conductor and a product of an electrical conductivity in a temperature range of 10 K (Kelvin) or less and a thickness of the tubular magnetic shield is 60 MS (Mega-Siemens) to 1980 MS.

11 Claims, 9 Drawing Sheets

Related U.S. Application Data continuation of application No. PCT/JP2018/012578, filed on Mar. 27, 2018.

(51) Int. Cl.

| | | |
|---|---|---|
| *F25B 9/10* | (2006.01) | |
| *F25D 19/00* | (2006.01) | |
| *G01R 33/38* | (2006.01) | |
| *G01R 33/3815* | (2006.01) | |
| *G01R 33/421* | (2006.01) | |
| *H01F 6/04* | (2006.01) | |
| *H05K 9/00* | (2006.01) | |

(52) U.S. Cl.
CPC ....... *F25D 19/006* (2013.01); *G01R 33/3804* (2013.01); *G01R 33/3806* (2013.01); *G01R 33/3815* (2013.01); *G01R 33/421* (2013.01); *H05K 9/0075* (2013.01); *F25B 2309/001* (2013.01); *F25B 2309/1406* (2013.01); *F25B 2309/1428* (2013.01); *F25B 2500/11* (2013.01); *F25B 2500/12* (2013.01)

(56) References Cited

U.S. PATENT DOCUMENTS

| | | | |
|---|---|---|---|
| 8,072,219 B2 | 12/2011 | Saito et al. | |
| 2007/0130961 A1* | 6/2007 | Xu | G01R 33/3804 |
| | | | 62/6 |
| 2009/0302844 A1* | 12/2009 | Saito | F25B 9/145 |
| | | | 165/4 |
| 2015/0253042 A1* | 9/2015 | Matsui | F25B 9/14 |
| | | | 62/6 |
| 2017/0167913 A1* | 6/2017 | Berthoud | G01J 1/0455 |
| 2019/0066865 A1* | 2/2019 | Fukuoka | C22C 9/00 |

* cited by examiner

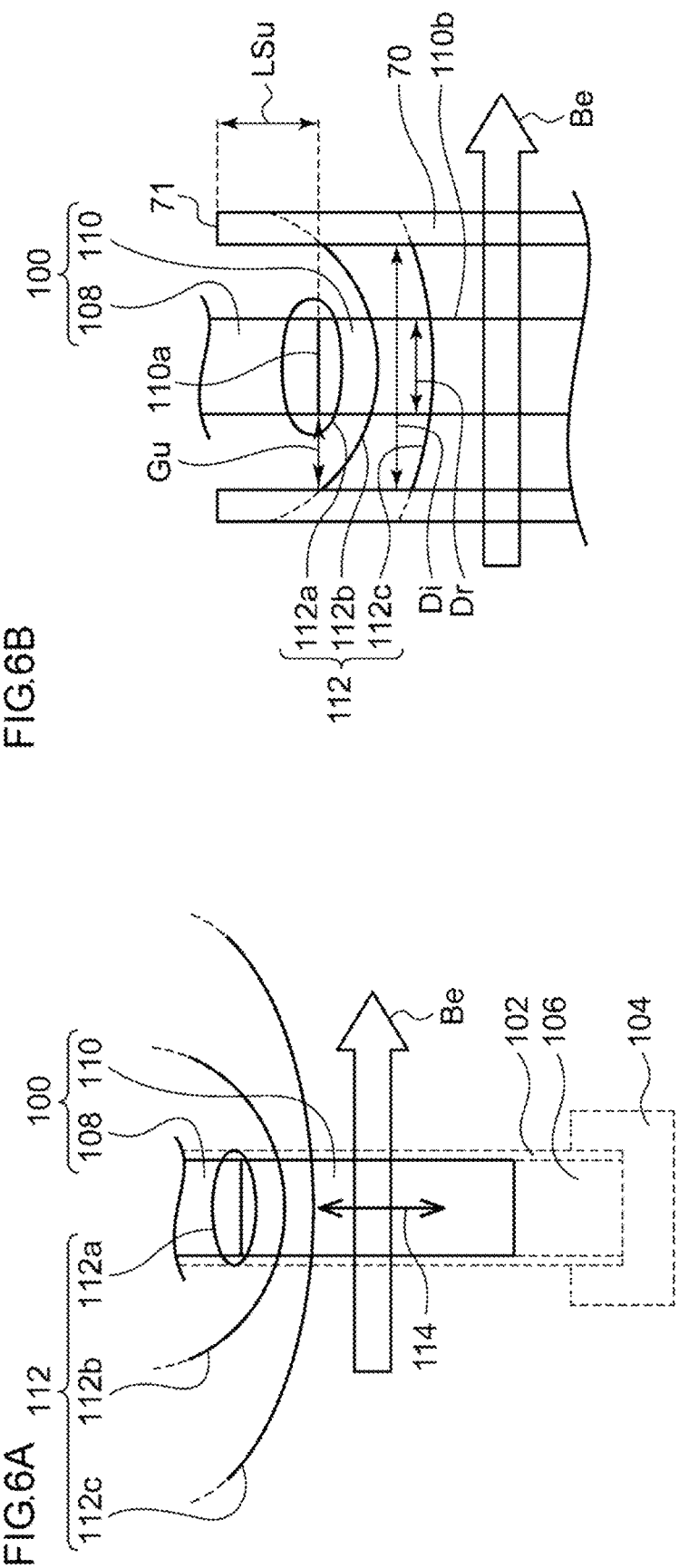

FIG.8
| Gu(mm) | LSu(mm) | LSu/Gu |
|---|---|---|
| 3(=Gu1) | 3.6(P1) | 1.2 |
| 8(=Gu2) | 9(P2) | 1.125 |
| 13(=Gu3) | 14.3(P3) | 1.1 |
FIG.9
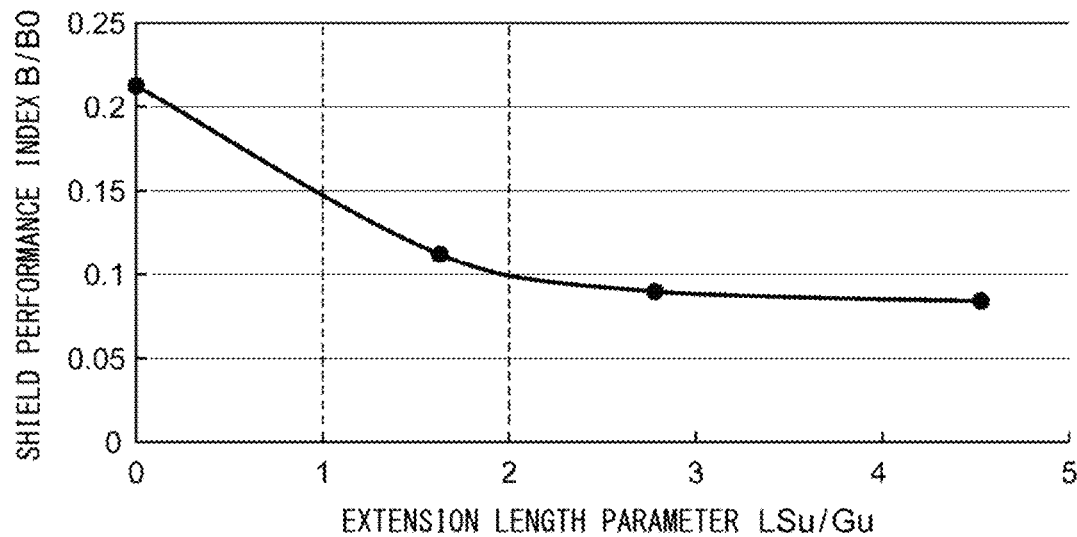
FIG.10
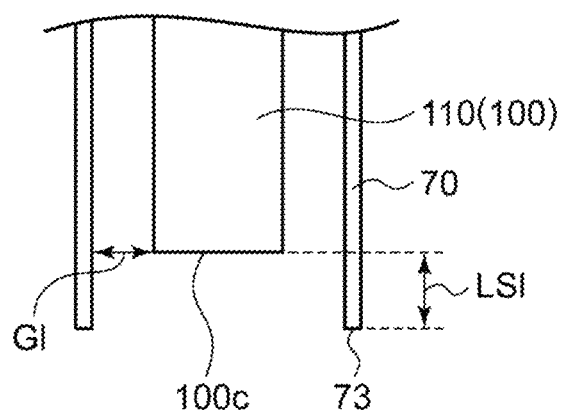

CRYOCOOLER AND MAGNETIC SHIELD

CROSS REFERENCE TO RELATED APPLICATIONS

This application claims priority to and is a continuation of U.S. application Ser. No. 16/584,938 filed on Sep. 26, 2019, which claims to Japanese Patent Application No. 2017-068412, filed Mar. 30, 2017, and International Patent Application No. PCT/JP2018/012578, the entire content of which is incorporated herein by reference.

BACKGROUND

Technical Field

Certain embodiment of the present invention relates to a cryocooler and a magnetic shield.

Description of Related Art

A cryocooler represented by a Gifford-McMahon (GM) cryocooler may be used in a strong magnetic field environment. For example, the GM cryocooler is used to cool a superconducting magnet system such as a Magnetic Resonance Imaging (MRI) apparatus. The GM cryocooler is provided in a superconducting magnet system for recondensing of liquid helium which cools a superconducting magnet. In order to cool to a liquid helium temperature of approximately 4.2 K or less, in general, a magnetic regenerator material is accommodated in a displacer of the GM cryocooler. A movement of the displacer accompanying an operation of the GM cryocooler causes a movement of the magnetic regenerator material in the magnetic field environment and generate magnetic noise. The magnetic noise may affect measurement accuracy of the MRI apparatus or other measuring devices.

For example, in the related art, a superconducting magnetic shield made of superconductor is suggested. This superconducting magnetic shield can be used for a superconducting magnet of an MRI apparatus.

SUMMARY

According to an embodiment of the present invention, there is provided a cryocooler including: a cooling stage; a cylinder which includes the cooling stage on a terminal of the cylinder; a displacer which includes a magnetic regenerator material and is accommodated in the cylinder so as to be able to reciprocate in the cylinder; and a tubular magnetic shield which is installed on the cooling stage and extends along the cylinder outside of the cylinder. The tubular magnetic shield is formed of a normal conductor and a product of an electrical conductivity in a temperature range of 10 K (Kelvin) or less and a thickness of the tubular magnetic shield is 60 MS (Mega-Siemens) to 1980 MS.

According to another embodiment of the present invention, there is provided a tubular magnetic shield which is directly installed on a cooling stage of a cryocooler. The magnetic shield is formed of a normal conductor and a product of an electrical conductivity in a temperature range of 10 K or less and a thickness of the tubular magnetic shield is 60 MS (Mega-Siemens) to 1980 MS.

BRIEF DESCRIPTION OF THE DRAWINGS

FIG. 6A is a schematic diagram showing a portion of a cryocooler according to a comparative example and FIG. 6B is a schematic diagram showing a portion of the cryocooler according to the embodiment.

FIG. 8 is a table showing radial distances Gu1, Gu2, and Gu3 and an axial extra length LSu of the magnetic shield in the examples of FIGS. 7A and 7B.

FIG. 9 is a graph showing a relationship between an extension length parameter of the magnetic shield and the shield performance index.

FIG. 10 is a schematic diagram partially showing the magnetic shield and a displacer according to another embodiment.

DETAILED DESCRIPTION

Figure 1:
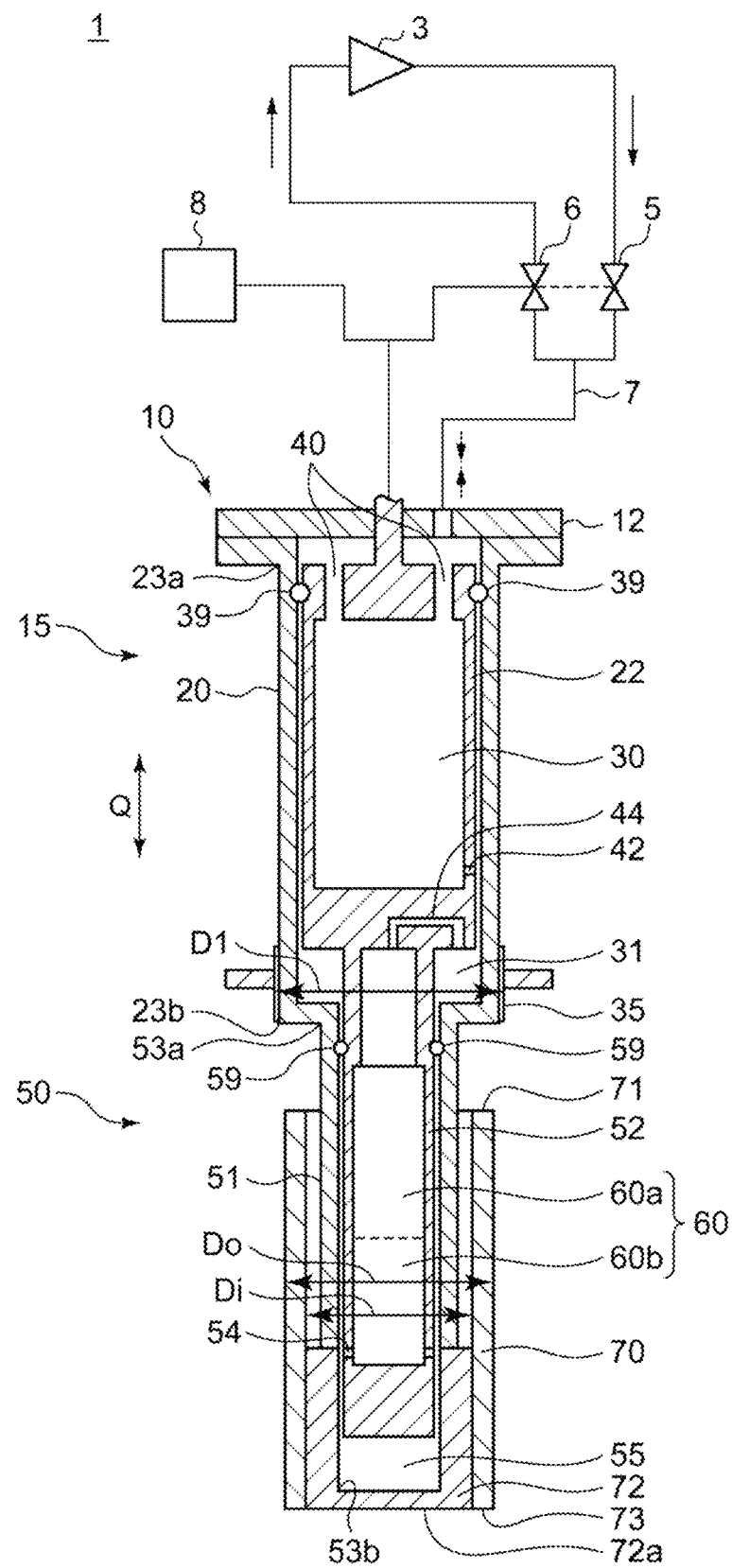
FIG. 1 is a diagram schematically showing a regenerative cryocooler according to an embodiment.

A superconductor is relatively expensive, and thus, a superconducting magnetic shield is also expensive.

It is desirable to suppress influences of a magnetic noise caused by a movement of a magnetic regenerator material to the surroundings without using the superconductor.

Aspects of the present invention include any combination of the above-described elements and mutual substitution of elements or expressions of the present invention among apparatuses, methods, systems, or the like.

According to the present invention, it is possible to suppress influences of magnetic noise caused by a movement of the magnetic regenerator material to the surroundings without using a superconductor.

Hereinafter, an embodiment of the present invention will be described in detail with reference to the drawings. In the descriptions and drawings, the same reference numerals are assigned to the same or equivalent constituent elements, members, and processing, and overlapping descriptions thereof are appropriately omitted. Scales and shapes of the respective portions shown in the drawings are set for the sake of convenience in order to facilitate explanation, and are not to be interpreted limitedly unless otherwise mentioned. The embodiment is an example and does not limit the scope of the present invention. All features and combinations thereof described in the embodiment are not necessarily essential to the invention.

FIG. 1 is a diagram schematically showing a regenerative cryocooler according to an embodiment. The regenerative cryocooler such as a GM cryocooler 1 includes a regenerator portion, an expander, and a compressor. In most cases, the regenerator portion is provided in the expander. The regenerator portion is configured to pre-cool a working gas (for example, helium gas). The expander includes a space which expands the pre-cooled working gas so as to further cool the working gas pre-cooled by the regenerator portion. The regenerator portion is configured to be cooled by the working gas cooled by expansion. The compressor is configured to recover the working gas from the regenerator portion, compress the working gas, and supply the working gas to the regenerator portion again.

Ina two-stage cryocooler such as the shown GM cryocooler 1, the regenerator portion includes a first-stage regenerator and a second-stage regenerator. The first-stage regenerator is configured to pre-cool the working gas supplied from the compressor to a low end temperature of the first-stage regenerator. The second-stage regenerator is configured to pre-cool the working gas pre-cooled by the first-stage regenerator to a low end temperature of the second-stage regenerator.

The GM cryocooler 1 includes a gas compressor 3 which functions as the compressor and a two-stage cold head 10 which functions as the expander. The cold head 10 includes a first-stage cooling section 15 and a second-stage cooling section 50, and the cooling sections are coaxially connected to a flange 12. The first-stage cooling section 15 includes a first-stage high-temperature end 23a and a first-stage low-temperature end 23b, and the second-stage cooling section 50 includes a second-stage high-temperature end 53a and a second-stage low-temperature end 53b. The first-stage cooling section 15 and the second-stage cooling section 50 are connected to each other in series. Accordingly, the first-stage low-temperature end 23b corresponds to the second-stage high-temperature end 53a.

The first-stage cooling section 15 includes a first-stage cylinder 20, a first-stage displacer 22, a first-stage regenerator 30, a first-stage expansion chamber 31, and a first-stage cooling stage 35. The first-stage cylinder 20 is a hollow hermetic container. The first-stage displacer 22 is provided in the first-stage cylinder 20 so as to be able to reciprocate in an axial direction Q. The first-stage regenerator 30 includes a first-stage regenerator material with which the inside of the first-stage displacer 22 is filled. In general, the first-stage regenerator material has a laminated structure configured of a plurality of wire gauzes. Accordingly, the first-stage displacer 22 is a container which accommodates the first-stage regenerator material. The first-stage expansion chamber 31 is formed in the first-stage cylinder 20 on the first-stage low-temperature end 23b. A volume of the first-stage expansion chamber 31 is changed by reciprocation of the first-stage displacer 22. The first-stage cooling stage 35 is attached to an outer side of the first-stage cylinder 20 on the first-stage low-temperature end 23b.

A plurality of first-stage high temperature-side flow passages 40 are provided on the first-stage high-temperature end 23a, specifically, a high-temperature side of the first-stage regenerator 30, in order to cause the helium gas to flow into or out from the first-stage regenerator 30. A plurality of first-stage low temperature-side flow passages 42 are provided on the first-stage low-temperature end 23b, specifically, a low-temperature side of the first-stage regenerator 30, in order to cause the helium gas to flow into or out from a portion between the first-stage regenerator 30 and the first-stage expansion chamber 31. A first-stage seal 39 is provided between the first-stage cylinder 20 and the first-stage displacer 22 so as to seal a gas flow in a gap between an inner surface of the first-stage cylinder 20 and an outer surface of the first-stage displacer 22. Accordingly, the flow of the working gas between the first-stage high-temperature end 23a and the first-stage low-temperature end 23b passes through the first-stage regenerator 30.

The second-stage cooling section 50 includes a second-stage cylinder 51, a second-stage displacer 52, a second-stage regenerator 60, a second-stage expansion chamber 55, and a second-stage cooling stage 72. The second-stage cylinder 51 forms a hollow hermetic container. The second-stage displacer 52 is provided in the second-stage cylinder 51 so as to be able to reciprocate in the axial direction Q. The second-stage regenerator 60 includes a second-stage regenerator material with which the inside of the second-stage displacer 52 is filled. Accordingly, the second-stage displacer 52 is a container which accommodates the second-stage regenerator material. The second-stage expansion chamber 55 is provided in the second-stage cylinder 51 on the second-stage low-temperature end 53b. A volume of the second-stage expansion chamber 55 is changed by reciprocation of the second-stage displacer 52. The second-stage cooling stage 72 is attached to an outer side of the second-stage cylinder 51 on the second-stage low-temperature end 53b.

The second-stage regenerator 60 is divided into a non-magnetic regenerator material 60a and a magnetic regenerator material 60b. The non-magnetic regenerator material 60a corresponds to a high temperature-side region of the second-stage regenerator 60, and for example, is configured of the second-stage regenerator material of a non-magnetic material such as lead or bismuth. The magnetic regenerator material 60b corresponds to a low temperature-side region of the second-stage regenerator 60, and for example, is configured of the second-stage regenerator material of a magnetic material such as $HoCu_2$. The magnetic regenerator material 60b uses a magnetic material whose specific heat increases according to a magnetic phase transition at a cryogenic temperature, as a regenerator material. Lead, bismuth, $HoCu_2$, or the like is formed in a spherical shape, and a plurality of spherical products are gathered so as to configure the second-stage regenerator material.

A second-stage high temperature-side flow passage 44 is provided on the second-stage high-temperature end 53a, specifically, a high-temperature side of the second-stage regenerator 60, in order to cause the helium gas to flow into or out from the second-stage regenerator 60. In the shown GM cryocooler 1, the second-stage high temperature-side flow passage 44 connects the first-stage expansion chamber 31 to the second-stage regenerator 60. A plurality of second-stage low temperature-side flow passages 54 are provided on the second-stage low-temperature end 53b, specifically, a low-temperature side of the second-stage regenerator 60, in order to cause the helium gas to flow into or out from the second-stage expansion chamber 55. A second-stage seal 59 is provided between the second-stage cylinder 51 and the second-stage displacer 52 so as to seal a gas flow in a gap between an inner surface of the second-stage cylinder 51 and an outer surface of the second-stage displacer 52. Accordingly, the flow of the working gas between the second-stage high-temperature end 53a and the second-stage low-temperature end 53b passes through the second-stage regenerator 60. In addition, the second-stage cooling section 50 may be configured so that some gas flows are permitted in the gap between the second-stage cylinder 51 and the second-stage displacer 52.

The GM cryocooler 1 includes a pipe 7 which connects the gas compressor 3 and the cold head 10 to each other. A high-pressure valve 5 and a low-pressure valve 6 are provided in the pipe 7. The GM cryocooler 1 is configured such that a high-pressure helium gas is supplied from the gas compressor 3 to the first-stage cooling section 15 via the high-pressure valve 5 and the pipe 7. In addition, the GM cryocooler 1 is configured such that a low-pressure helium gas is discharged from the first-stage cooling section 15 to the gas compressor 3 via the pipe 7 and the low-pressure valve 6.

The GM cryocooler 1 includes a drive motor 8 for reciprocating the first-stage displacer 22 and the second-stage displacer 52. The first-stage displacer 22 and the second-stage displacer 52 are integrally reciprocated in the axial direction Q by the drive motor 8. In addition, the drive motor 8 is connected to the high-pressure valve 5 and the low-pressure valve 6 to selectively switch opening of the high-pressure valve 5 and opening of the low-pressure valve 6 in conjunction with the reciprocation. In this way, the GM cryocooler 1 is configured to appropriately switch an intake stroke and an exhaust stroke of the working gas.

An operation of the GM cryocooler 1 configured as described above will be described. First, when each of the first-stage displacer 22 and the second-stage displacer 52 is positioned at or near a bottom dead center in each of the first-stage cylinder 20 and the second-stage cylinder 51, the high-pressure valve 5 is opened. Each of the first-stage displacer 22 and the second-stage displacer 52 moves from the bottom dead center toward a top dead center. During this, the low-pressure valve 6 is closed.

A high-pressure helium gas flows into the first-stage cooling section 15 from the gas compressor 3. The high-pressure helium gas flows from the first-stage high-temperature side flow passage 40 to the inside of the first-stage displacer 22 and is cooled to a predetermined temperature by the first-stage regenerator 30. The cooled helium gas flows from the first-stage low temperature-side flow passages 42 into the first-stage expansion chamber 31. A portion of the high-pressure helium gas which has flowed into the first-stage expansion chamber 31 flows from the second-stage high-temperature side flow passages 44 to the inside of the second-stage displacer 52. The helium gas is cooled to a lower predetermined temperature by the second-stage regenerator 60 and flows from the second-stage low temperature-side flow passages 54 into the second-stage expansion chamber 55. As a result, a state in each of the first-stage expansion chamber 31 and the second-stage expansion chamber 55 becomes a high-pressure state.

If each of the first-stage displacer 22 and the second-stage displacer 52 reaches the top dead center or the vicinity thereof in each of the first-stage cylinder 20 and the second-stage cylinder 51, the high-pressure valve 5 is closed. Approximately simultaneously with the closing of the high-pressure valve 5, the low-pressure valve 6 is opened. The first-stage displacer 22 and the second-stage displacer 52 move from the top dead center toward the bottom dead center this time.

The helium gas in the first-stage expansion chamber 31 and the second-stage expansion chamber 55 is decompressed and expanded. As a result, the helium gas is cooled. In addition, each of the first-stage cooling stage 35 and the second-stage cooling stage 72 is cooled. The low-pressure helium gas passes through reverse passages to the above-described passages, and is returned to the gas compressor 3 via the low-pressure valve 6 and the pipe 7 while cooling each of the first-stage regenerator 30 and the second-stage regenerator 60.

If each of the first-stage displacer 22 and the second-stage displacer 52 reaches the bottom dead center or the vicinity thereof in each of the first-stage cylinder 20 and the second-stage cylinder 51, the low-pressure valve 6 is closed. Approximately simultaneously with the closing of the low-pressure valve 6, the high-pressure valve 5 is opened again.

In the GM cryocooler 1, the above-described operations are set to one cycle, and this cycle is repeated. In this manner, the GM cryocooler 1 absorbs heat from a cooling target (not shown) which is thermally connected to each of the first-stage cooling stage 35 and the second-stage cooling stage 72, and can cool the cooling target. Hereinafter, the number of cycles per unit time (for example, 1 second) may be referred to as an operation frequency of the cryocooler.

For example, a temperature of the first-stage high-temperature end 23a is the room temperature. For example, a temperature of each of the first-stage low-temperature end 23b and the second-stage high-temperature end 53a (that is, the first-stage cooling stage 35) is within a range of approximately 20 K to 40 K. For example, a temperature of the second-stage low-temperature end 53b (that is, the second-stage cooling stage 72) is approximately 4 K.

The GM cryocooler 1 includes a tubular magnetic shield (hereinafter, simply referred to as a "magnetic shield") which is provided in the second-stage cooling stage 72. The magnetic shield 70 extends along the second-stage cylinder 51 outside the second-stage cylinder 51. The magnetic shield 70 is disposed outside an outer peripheral surface of the second-stage cylinder 51 and surrounds the periphery of the second-stage cylinder 51. One end of the magnetic shield 70 is fixed to the second-stage cooling stage 72 and the other end of the magnetic shield 70 extends toward the second-stage high-temperature end 53a (or the first-stage cooling stage 35). The magnetic shield 70 is a cylindrical member having a larger diameter than that of the second-stage cylinder 51 and is coaxially disposed with the second-stage cylinder 51.

The magnetic shield 70 is thermally coupled to the second-stage cooling stage 72 and is cooled to a temperature (for example, a temperature of approximately 4.2 K or less) of the second-stage cooling stage 72. The magnetic shield 70 is not in physical contact with the first-stage cooling section 15. An axial upper end 71 of the magnetic shield 70 is separated from the first-stage cooling stage 35 in the axial direction. The magnetic shield 70 is not in physical contact with the second-stage cylinder 51. An inner surface of the magnetic shield 70 is separated from an outer surface of the second-stage cylinder 51 in radial direction.

The magnetic shield 70 is formed of a normal conductor. In the present specification, a material which does not transition to superconductivity even after the material is cooled to 4 K is referred to as the normal conductor. In addition, the magnetic shield 70 is formed of a non-magnetic metallic material. For example, the magnetic shield 70 is formed of a good electric conductor such as pure copper. The pure copper for the magnetic shield 70 may have a purity of at least 99.95%, or preferably at least 99.99%. Typically, the second-stage cooling stage 72 is formed of copper from the viewpoint of high thermal conductivity. The magnetic shield 70 may be formed of the same material as that of the second-stage cooling stage 72. The magnetic shield 70 may be formed of pure aluminum. The pure aluminum for the magnetic shield 70 may have a purity of at least 99.99%. For example, the second-stage cylinder 51 is formed of a metallic material such as stainless steel and the magnetic shield 70 is formed of a material having an electrical resistivity lower than that of the second-stage cylinder 51. The magnetic shield 70 surrounds the entire periphery of the second-stage cylinder 51, and thus, a current circulating around the second-stage cylinder 51 can flow through the magnetic shield 70.

The magnetic shield 70 extends over the entire movement range of the magnetic regenerator material 60b moved by the reciprocation of the second-stage displacer 52. The magnetic shield 70 has a length which exceeds a movement stroke of the magnetic regenerator material 60b in the axial direction Q of the second-stage cylinder 51 and is disposed so as to include the movement stroke of the magnetic regenerator material 60b. An axial lower end 73 of the magnetic shield 70 is positioned below a lowermost end of the magnetic regenerator material 60b when the second-stage displacer 52 is positioned at the bottom dead center according to the operation of the cryocooler. The axial upper end 71 of the magnetic shield 70 is positioned above an uppermost end of the magnetic regenerator material 60b when the second-stage displacer 52 is positioned at the top dead center according to the operation of the cryocooler. Accordingly, it is possible to sufficiently shield leakage of a magnetic noise generated from the magnetic regenerator material 60b in the magnetic field to the surroundings.

If the magnetic regenerator material 60b is reciprocated in the axial direction Q, a magnetic flux interlinked with the magnetic shield 70 is changed. In order to cancel the change of the magnetic flux, a current flows to the magnetic shield 70. Flow directions of the current are different from each other according to the disposition of the GM cryocooler 1 and the applied magnetic field. However, for example, the current flows in the axial direction Q, flows to circulate around the axial direction Q, or flows in other directions. Due to this current, the change of the magnetic field in an area outside the magnetic shield 70 is canceled out. Accordingly, disturbance of the magnetic field in a space outside the magnetic shield 70 can decrease.

In a case where a magnetic material such as iron or a metallic material having minute magnetization such as stainless steel is attached to the second-stage displacer 52, the materials also become a factor of disturbing the magnetic field. The magnetic shield 70 also has an effect of suppressing the disturbance of this magnetic field.

For example, the magnetic shield 70 may be formed of a good electric conductor, and it is not necessary to form the magnetic shield 70 from a relatively expensive superconductor such as niobium titanium (NbTi). Accordingly, it is possible to reduce a cost of the device.

The magnetic shield 70 is installed in the second-stage cooling stage 72, and thus, it is easy to provide the GM cryocooler 1 and the magnetic shield 70 as one product. For example, a manufacturer of the GM cryocooler 1 can provide the GM cryocooler 1 to a cryocooler purchaser in a state where the magnetic shield 70 is attached to the GM cryocooler 1.

Here, B/B0 is defined as a shield performance index (hereinafter, simply referred to as a "shield performance index") with respect to a magnetic field fluctuation. B represents a magnitude of the magnetic field fluctuation generated inside the magnetic shield 70 when the magnetic shield 70 is disposed under a certain magnetic field fluctuation environment. B0 represents the magnitude of the magnetic field fluctuation at the same position in a state where the magnetic shield 70 is not disposed. Therefore, the shield performance index B/B0 with respect to the magnetic field fluctuation represents a shielding effect of an external magnetic field fluctuation by the magnetic shield 70. The shield performance index B/B0 has a value between 0 and 1, and the shield effect of the external magnetic field fluctuation increases as the value decreases.

In addition, the magnetic shield 70 can prevent the magnetic field fluctuation generated outside the magnetic shield 70 from being transferred from the outside of the magnetic shield 70 to the inside thereof. In addition, the magnetic shield 70 can prevent the magnetic field fluctuation (as described above, for example, the magnetic noise or the magnetic field fluctuation caused by the periodic reciprocation of the magnetic regenerator material 60b) generated inside the magnetic shield 70 from being transferred from the inside of the magnetic shield 70 to the outside thereof. The shielding effect of the external fluctuation magnetic field to the inside of the magnetic shield 70 and the shielding effect of the internal fluctuation magnetic field to the outside of the magnetic shield 70 are physically equivalent to each other. Therefore, the shield performance index represents the shielding effect of the internal fluctuation magnetic field to the outside of the magnetic shield 70. As the shield performance index B/B0 decreases, the shielding effect of the internal fluctuation magnetic field to the outside of the magnetic shield 70 increases.

Figure 2:
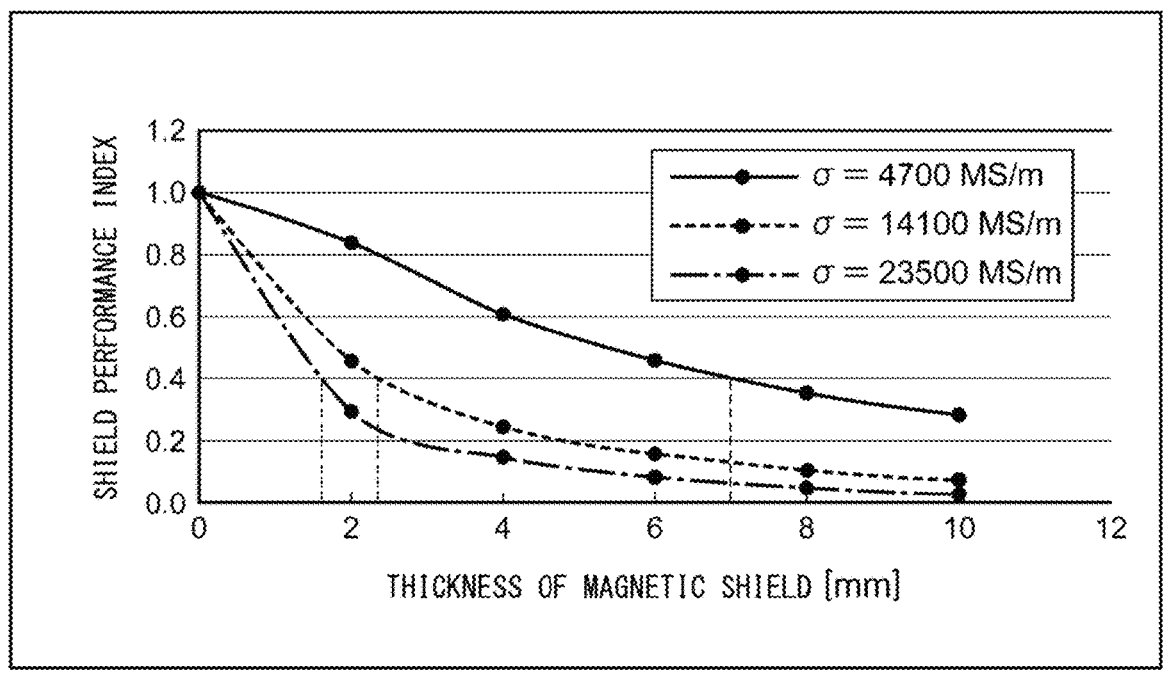
FIG. 2 is a graph showing a relationship between a thickness of a magnetic shield and a shield performance index.

FIG. 2 is a graph showing a relationship between a thickness of the magnetic shield 70 and the shield performance index B/B0 and is obtained by analysis of the present inventors. Calculation results with respect to several magnetic shield materials having different electrical conductivities σ at 4 K are shown. The results shown in FIG. 2 indicate the shielding effect of the magnetic field fluctuation by the magnetic shield 70. In the analysis, an electrical conductivity of the magnetic shield 70 is set to an appropriate value, and an operation frequency of the cryocooler is set to 1 Hz.

As understood from FIG. 2, the shield performance index B/B0 decreases as the thickness of the magnetic shield 70 increases, and thus, the fluctuation magnetic field shielding effect of the magnetic shield 70 increases. In this study, for example, it is assumed that good fluctuation magnetic field shielding can be obtained when the shield performance index B/B0 is smaller than 0.4. Then, in a case where the magnetic shield 70 is formed of a material having an electrical conductivity σ of 4700 MS/m, a thickness of approximately 7 mm is necessary for good fluctuation magnetic field shielding. Similarly, for a material having an electrical conductivity σ of 14100 MS/m, a thickness of approximately 2.5 mm is required, and for a material having an electrical conductivity σ of 23500 MS/m, a thickness of approximately 1.5 mm is required. A degree to which the thickness of the magnetic shield 70 should be designed to obtain a desired value of the shield performance index B/B0 depends on the electrical conductivity at 4 K of the material of the magnetic shield 70 and is not uniform.

Based on the unique investigation by the present inventors, the present inventors devise a novel parameter called a product (σ·t) of the electrical conductivity σ of the material forming the magnetic shield 70 and a thickness t of the magnetic shield 70. Hereinafter, this parameter is referred to as a magnetic shield parameter. The electrical conductivity is expressed in units of MS/m (Mega-Siemens per meter) and the thickness of magnetic shield 70 is expressed in units of m. Therefore, the magnetic shield parameter is expressed in units of MS (Mega-Siemens).

Here, the electrical conductivity is used in a temperature range of 10 K or less. An electrical conductivity in a normal conduction state of pure metals such as copper and aluminum is almost constant in the temperature range of 10 K or less. Therefore, as representative, for example, the electrical conductivity at approximately 4 K (for example, 4.2 K) can be used to calculate the magnetic shield parameter. In addition, this temperature range may be larger than absolute zero degree or 2 K or more.

The thickness of the magnetic shield 70 is a numerical value obtained by dividing a difference between the maximum outer diameter and the minimum inner diameter of the magnetic shield 70 by 2. In a case where the magnetic shield 70 has a simple cylindrical shape, the thickness of the magnetic shield 70 is obtained as a numerical value obtained by dividing the difference between the outer diameter and the inner diameter of the magnetic shield 70 by 2. A shape of a cross section of the magnetic shield 70 perpendicular in an axial direction of has any shape. The thickness of the magnetic shield 70 may have a distribution in the circumferential direction of the magnetic shield 70. The magnetic shield 70 may be a tubular member having an elliptical shape or other cross-sectional shapes.

Figure 3:
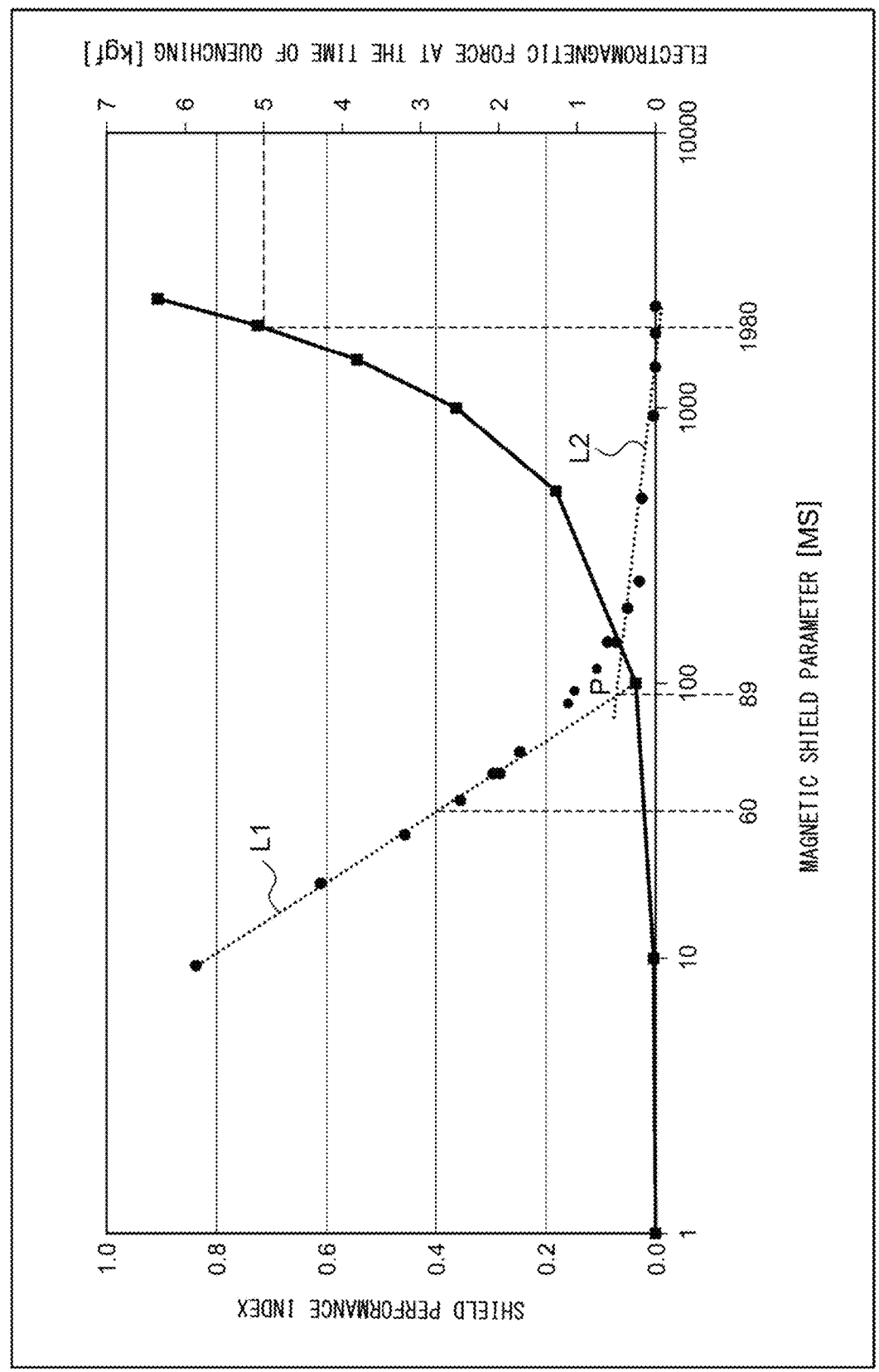
FIG. 3 is a graph showing a relationship between a magnetic shield parameter and a shield performance index.

FIG. 3 is a graph showing a relationship between the magnetic shield parameter and the shield performance index B/B0. The black dots shown in FIG. 3 are obtained by rearranging the three graphs (in three cases where the electrical conductivity σ is 4700 MS/m, 14100 MS/m, and 23500 MS/m) shown in FIG. 2 using the magnetic shield parameter (that is, the product of the electrical conductivity in the temperature range of 10 K or less and the thickness of the magnetic shield 70).

As understood from FIG. 3, regardless of the value of the electrical conductivity, the relationship between the magnetic shield parameter and the shield performance index B/B0 is a single curve. Hereinafter, this curve is referred to as a shield performance index curve. According to the shield performance index curve, it is possible to set an appropriate range of a magnetic shield parameter for obtaining a value of a desired shield performance index B/B0.

For example, by setting the magnetic shield parameter of the magnetic shield 70 to approximately 60 MS or more, the shield performance index B/B0 can be smaller than 0.4. In this way it is possible to obtain a good fluctuation magnetic field shielding effect.

In addition, a behavior of the shield performance index curve shown in FIG. 3 is changed with a region, in which the value the magnetic shield parameter is approximately 100 MS, as a boundary. In a case where the value of the magnetic shield parameter is less than approximately 100 MS, the shield performance index curve is almost a straight line L1, and an inclination of the straight line L1 is relatively large. Meanwhile, in a case where the value of the magnetic shield parameter is greater than approximately 100 MS, the shield performance index curve substantially coincides with the other straight line L2, and an inclination of the straight line L2 is relatively small. The two straight lines are derived by least squares method and an intersection P of these straight lines is obtained. The value of the magnetic shield parameter at this intersection is approximately 89 MS.

It is considered that the value of the magnetic shield parameter increases from the minimum value (for example, 1 MS) to the maximum value (for example, 10000 MS). In a case where the value of the magnetic shield parameter is less than approximately 89 MS, a decrease degree of the shield performance index B/B0 per unit increment of the magnetic shield parameter is large. A degree of improvement of the fluctuation magnetic field shielding effect due to the increase of the magnetic shield parameter is large. Meanwhile, in a case where the value of the magnetic shield parameter is approximately 89 MS or more, the decrease degree of the shield performance index B/B0 per unit increment of the magnetic shield parameter is small. It can be said that the shield performance index B/B0 is almost saturated.

Therefore, by setting the magnetic shield parameter of the magnetic shield 70 to approximately 89 MS or more, a sufficiently small shield performance index B/B0 can be realized. A better fluctuation magnetic field shielding effect can be obtained. In other words, even if the value of the magnetic shield parameter excessively increases, a contribution to a decrease in the shield performance index B/B0, that is, improvement of the fluctuation magnetic field shielding effect is small.

In a case where the magnetic shield 70 is formed of pure copper, a residual resistance ratio (RRR) at 4 K of a material having purity relatively easily obtained is in a range of approximately 300 to 1000. For example, in a case where the residual resistance ratio is 300 which is the minimum value of the range easily obtained, if the value of the magnetic shield parameter is set to 89 MS or more, a thickness of the pure copper magnetic shield 70 is approximately 5 mm or more. Therefore, if the magnetic shield 70 is formed of pure copper and the thickness of the magnetic shield 70 is set to approximately 5 mm or more, it is guaranteed to obtain a good fluctuation magnetic field shielding effect. Further, in order to suppress weight of the magnetic shield 70 to facilitate handling, the thickness of the pure copper magnetic shield 70 is approximately 10 mm or less.

Meanwhile, in quenching occurs in the superconducting magnet, the external magnetic field around the magnetic shield 70 disappears. The rapid decrease of the external magnetic field induces a large eddy current particularly in the magnetic shield 70 in a case where the magnetic shield 70 has high electrical conductivity. A transient electromagnetic force corresponding to a magnitude of the eddy current is applied to the magnetic shield 70. An excessive electromagnetic force may cause mechanical damages to the magnetic shield 70 or the GM cryocooler 1.

Another curve shown in FIG. 3 shows a relationship between the magnetic shield parameter and the electromagnetic force generated in the magnetic shield 70 at the time of quenching. This result is also obtained by numerical analysis by the present inventors. If the electromagnetic force acting on the magnetic shield 70 exceeds about 5 kgf, the mechanical performance of the GM cryocooler 1 may be affected.

For example, by setting the magnetic shield parameter of the magnetic shield 70 to approximately 1980 MS or less, it is possible to decrease the electromagnetic force acting on the magnetic shield 70 to less than approximately 5 kgf. Further, by setting the magnetic shield parameter of the magnetic shield 70 to approximately 1000 MS or less, it is possible to decrease the electromagnetic force acting on the magnetic shield 70 to less than approximately 2 kgf. By setting the magnetic shield parameter of the magnetic shield 70 in this way, it is possible to reduce the possibilities of mechanical damages of the magnetic shield 70 or the GM cryocooler 1 in the case where the quenching occurs in the superconducting magnet.

In a case where the magnetic shield 70 is formed of pure aluminum, the residual resistance ratio at 4 K of a relatively accessible material is in the range of approximately 2000 to 10000. For example, in a case where the residual resistance ratio is 10000 which is the maximum value of the range easily obtained, if the value of the magnetic shield parameter is set to 1980 MS or less, the thickness of the pure aluminum magnetic shield 70 is approximately 5.6 mm or less. To ensure the mechanical strength of the pure aluminum magnetic shield 70 itself, for example, preferably, the thickness of the magnetic shield 70 is approximately 0.5 mm or more or approximately 1 mm or more.

Figure 4:
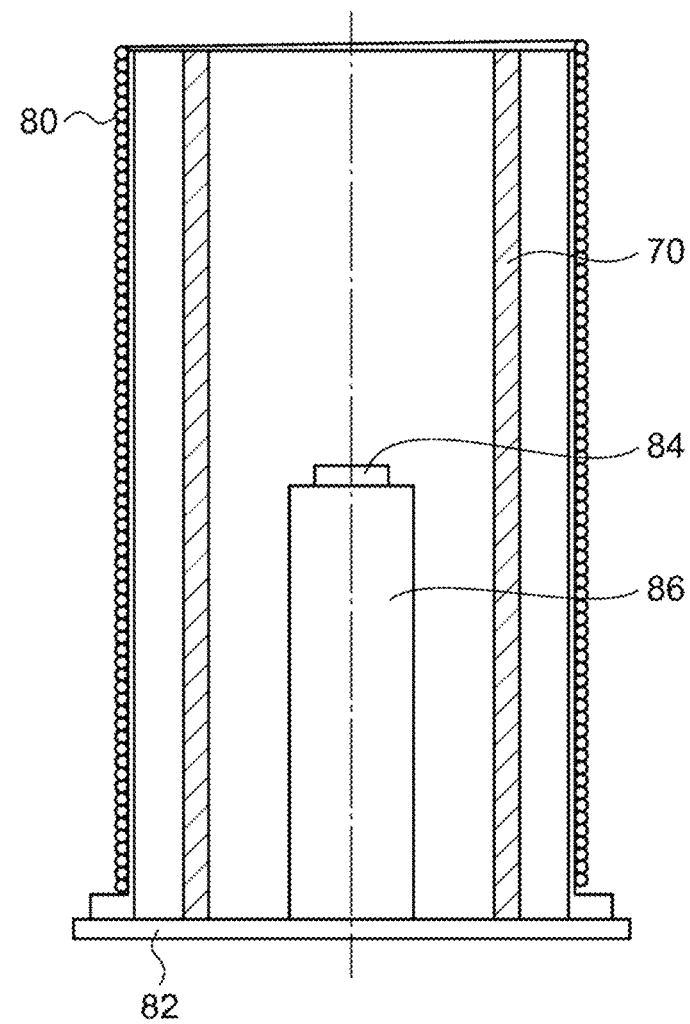
FIG. 4 is a schematic diagram showing a configuration for measuring electrical conductivity of the magnetic shield.

FIG. 4 is a schematic diagram showing a configuration for measuring the electrical conductivity of the magnetic shield 70. The magnetic shield 70 and a coil 80 are installed on the pedestal 82. The coil 80 is installed on the pedestal 82 coaxially with a central axis of the magnetic shield 70 so as to surround the magnetic shield 70. By applying current to the coil 80, an axial magnetic field can be applied to the magnetic shield 70. In addition, a magnetic field sensor 84 such as a Hall element is disposed on the central axis of the magnetic shield 70. The magnetic field sensor 84 is disposed on a sensor base 86 installed on the pedestal 82.

The magnetic shield 70 is cooled by an appropriate cooling means. For example, the magnetic shield 70 may be cooled to a desired temperature (a temperature of 10 K or less, for example, approximately 4.2 K) by immersing the shown entire measurement configuration in a coolant such as liquid helium. Alternatively, the magnetic shield 70 may be thermally coupled to a cryocooler such as the GM cryocooler so as to be cooled.

In a state where the magnetic shield 70 is cooled to a cryogenic temperature, a constant current is passed through the coil 80. A constant magnetic field corresponding to the coil current is generated around the magnetic shield 70. After a sufficient time has elapsed, energization to the coil 80 is stopped. Therefore, an induced current is generated in the magnetic shield 70. The electrical conductivity of the magnetic shield 70 can be calculated back from an attenuation curve of the magnetic field generated by the induced current. A time constant $\tau$ of the attenuation curve of the magnetic field is $\tau = L/R$. Here, L represents a self-inductance of the magnetic shield 70 and R represents an electric resistance value of the magnetic shield 70. The self-inductance L is a known value calculated from a shape of the magnetic shield 70 or the like. Since the time constant $\tau$ is obtained from the attenuation curve measured by the magnetic field sensor 84, the electrical resistance value R in the circumferential direction of the magnetic shield 70 is obtained. From the electric resistance value R, the electrical conductivity of the magnetic shield 70 at a cryogenic temperature can be obtained.

Figure 5A:
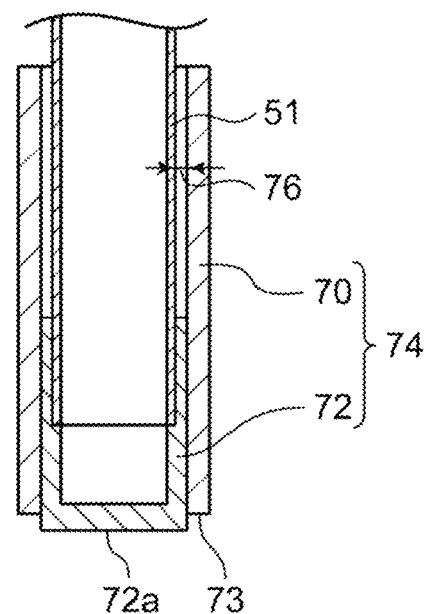
FIGS. 5A and 5B are schematic diagrams showing installation of the magnetic shield on a second-stage cooling stage.
Figure 5B:
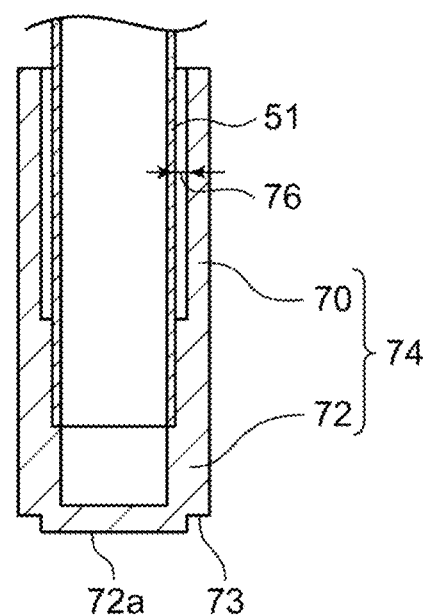

FIGS. 5A and 5B are schematic diagrams showing installation of the magnetic shield 70 on the second-stage cooling stage 72. The magnetic shield 70 is directly attached to the second-stage cooling stage 72.

As shown in FIG. 1, an inner diameter Di of the magnetic shield 70 is smaller than an outer diameter D1 of the first-stage cylinder 20 or the first-stage cooling stage 35. As a result, when the magnetic shield 70 is attached to the second-stage cooling stage 72, the overall size of the GM cryocooler 1 can be compacted. In addition, an outer diameter Do of the magnetic shield 70 may also be smaller than the outer diameter D1 of the first-stage cylinder 20 or the first-stage cooling stage 35. In this way, the size of the GM cryocooler 1 with magnetic shield becomes even more compact.

As shown in FIG. 5A, the magnetic shield component 74 includes the magnetic shield 70 and the second-stage cooling stage 72. The magnetic shield 70 is directly joined to the second-stage cooling stage 72. In a process of manufacturing the GM cryocooler 1, the magnetic shield 70 can be joined to the second-stage cooling stage 72, and thus, the manufacturing is easily performed. For example, the direct joining between the magnetic shield 70 and the second-stage cooling stage 72 is performed by brazing. The magnetic shield 70 is formed of a metallic material having a relatively high melting point such as pure copper, and thus, the brazing can be performed. In the process of the brazing between the second-stage cylinder 51 and the second-stage cooling stage 72, the magnetic shield 70 can be similarly joined, and thus, the manufacturing is easily performed. The direct joining between the magnetic shield 70 and the second-stage cooling stage 72 may be performed by an adhesive.

As shown in FIG. 5B, the magnetic shield 70 is integrally formed with the second-stage cooling stage 72. The magnetic shield 70 is provided as an integral part of the second-stage cooling stage 72. This integral magnetic shield component 74 is brazed to the second-stage cylinder 51. The magnetic shield 70 is integrated with the second-stage cooling stage 72, and thus, a process of joining the magnetic shield 70 and the second-stage cooling stage 72 is not necessary. Therefore, the manufacturing is easily performed.

In order to avoid a thermal contact between the magnetic shield 70 and the second-stage cylinder 51 without excessively increasing the size of the magnetic shield 70, preferably, a distance 76 between the inner surface of the magnetic shield 70 and the outer surface of the second-stage cylinder 51 is 0.1 mm to 10 mm (for example, 2 mm to 8 mm, or approximately 5 mm).

FIG. 6A is a schematic diagram showing a portion of a cryocooler according to a comparative example and FIG. 6B is a schematic diagram showing a portion of the cryocooler according to the embodiment. FIG. 6A and FIG. 6B show how a displacer 100 of the cryocooler is positioned at the top dead center. The comparative example shown in FIG. 6A does not have a magnetic shield, but the embodiment shown in FIG. 6B has the magnetic shield 70. For example, the cryocooler can be disposed in a high magnetic field environment, such as an external magnetic field Be by a superconducting electromagnet.

Here, the top dead center of the displacer 100 indicates a position of the displacer 100 where the displacer 100 is farthest from a cooling stage 104 and a volume of an expansion chamber 106 is maximized in an axial reciprocation of the displacer 100 in a cylinder 102. In addition, the bottom dead center of the displacer 100 indicates a position of the displacer 100 where the displacer 100 comes closest to the cooling stage 104 and the volume of the expansion chamber 106 minimized in the axial reciprocation of the displacer 100 in the cylinder 102. For the sake of simplicity, the cylinder 102 and the cooling stage 104 are shown by broken lines in FIG. 6A and are not shown in FIG. 6B.

As an example, the displacer 100, the cylinder 102, the cooling stage 104, and the expansion chamber 106 may be the second-stage displacer 52, the second-stage cylinder 51, the second-stage cooling stage 72, and the second-stage expansion chamber 55 shown in FIG. 1, respectively.

The displacer 100 has a non-magnetic regenerator material 108 and a magnetic regenerator material 110 therein. A high-temperature side (that is, axially upper side) of the displacer 100 is filled with the non-magnetic regenerator material 108 and a low-temperature side (that is, axially lower side) of the displacer 100 is filled with the magnetic regenerator material 110. The magnetic regenerator material 110 may include one or more kinds of magnetic regenerator materials.

For example, the external magnetic field Be is oriented in a direction orthogonal to the axial direction of displacer 100. The magnetic regenerator material 110 is magnetized by the external magnetic field Be and a magnetic field 112 is generated. Since the comparative example shown in FIG. 6A does not have the magnetic shield, the magnetic field 112 emitted from the magnetic regenerator material 110, passes through the outside of the magnetic regenerator material 110, and returns to the magnetic regenerator material 110. For convenience of explanation, several magnetic force lines (112a to 112c) near an upper end of the magnetic regenerator material 110 are shown. The magnetic field 112 may be transferred to the surroundings as varying magnetic noise as the displacer 100 reciprocates in the axial direction (arrow 114). The magnetic noise is undesirable as described above.

According to the embodiment, as described above, the magnetic shield 70 may extend over the entire movement range of the magnetic regenerator material 110 moved by the axial reciprocation of the displacer 100. Accordingly, the axial upper end 71 of the magnetic shield 70 may extend to the same position as or higher than an upper surface 110a of the magnetic regenerator material 110 when the displacer 100 is positioned at the top dead center.

As an example, the magnetic shield 70 may extend upward by a length of approximately 20 mm or less from an upper end of the movement range of the magnetic regenerator material 110.

In this case, as shown in FIG. 6B, most of the magnetic force lines (112b, 112c) of the magnetic field 112 intersect the magnetic shield 70, and due to an electromagnetic interaction between the magnetic shield 70 and the magnetic field 112, leakage of a varying magnetic field component to the outside is suppressed. A magnetic force line 112a of the magnetic field 112 generated in the immediate vicinity of the upper surface 110a of the magnetic regenerator material 110 do not intersect the magnetic shield 70. However, a spatial extent of the magnetic force line 112a is limited to only the vicinity of the upper surface 110a of the magnetic regenerator material 110, and thus, the magnetic force line 112a does not significantly adversely affect the surroundings. In this way, the magnetic shield 70 can sufficiently decrease the magnetic noise caused by the magnetization of the magnetic regenerator material 110 by the external magnetic field Be.

For convenience of explanation, as shown in FIG. 6B, an axial extra length of the magnetic shield 70 from the upper surface 110a of the magnetic regenerator material 110 when the displacer 100 is positioned at the top dead center is denoted as LSu, and a radial distance from the upper surface 110a of the magnetic regenerator material 110 to the magnetic shield 70 when the displacer 100 is positioned at the top dead center is denoted as Gu.

The axial extra length LSu of the magnetic shield 70 corresponds to an axial height from the upper surface 110a of the magnetic regenerator material 110 to the axial upper end 71 of the magnetic shield 70. In general, the magnetic shield 70 has a cylindrical shape, and thus, the axial position of the axial upper end 71 of the magnetic shield 70 is constant in the circumferential direction. However, this is not indispensable, and the axial position of the axial upper end 71 of the magnetic shield 70 may not be constant in the circumferential direction. In this case, the axial extra length LSu may be determined as a height from the magnetic regenerator material 110 at the highest axial position among the axial upper ends 71 of the magnetic shield 70.

The radial distance Gu is a distance from a side surface 110b of the magnetic regenerator material 110 to the magnetic shield 70 and is defined as a half of a value obtained by subtracting an outer diameter Dr of the magnetic regenerator material 110 from the inner diameter Di of the magnetic shield 70 (that is, Gu=(Di−Dr)/2). The outer diameter Dr of the magnetic regenerator material 110 is equal to the inner diameter of the displacer 100 as a regenerator material container accommodating the magnetic regenerator material 110. In general, the displacer 100 (magnetic regenerator material 110) and magnetic shield 70 have a cylindrical shape and are coaxially disposed with each other, the radial distance Gu is constant in the circumferential direction. However, in a case where the inner diameter Di of the magnetic shield 70 is not constant in the circumferential direction and/or the outer diameter Dr of the magnetic regenerator material 110 is not constant in the circumferential direction, the radial distance Gu may be obtained as a half of a value obtained by subtracting a maximum value of the outer diameter Dr of the magnetic regenerator material 110 from a minimum value of the inner diameter Di of the magnetic shield 70.

Meanwhile, if the axial extra length LSu of the magnetic shield 70 is sufficiently long, it is advantageous in that effects for decreasing the magnetic noise are enhanced by preventing most of the magnetic field 112 emitted from the magnetic regenerator material 110 by the external magnetic field Be from leaking the outside. However, the axial extra length LSu of the excessively long magnetic shield 70 increases the weight of the magnetic shield 70 and increases a heat capacity of the magnetic shield 70, and thus, it is disadvantageous in that a long time is required to cool the magnetic shield 70. If the magnetic shield 70 is shortened, this disadvantage decreases. However, the effects of decreasing magnetic noise also decreases. Therefore, optimization of the axial extra length LSu of the magnetic shield 70 is considered.

Figure 7A:
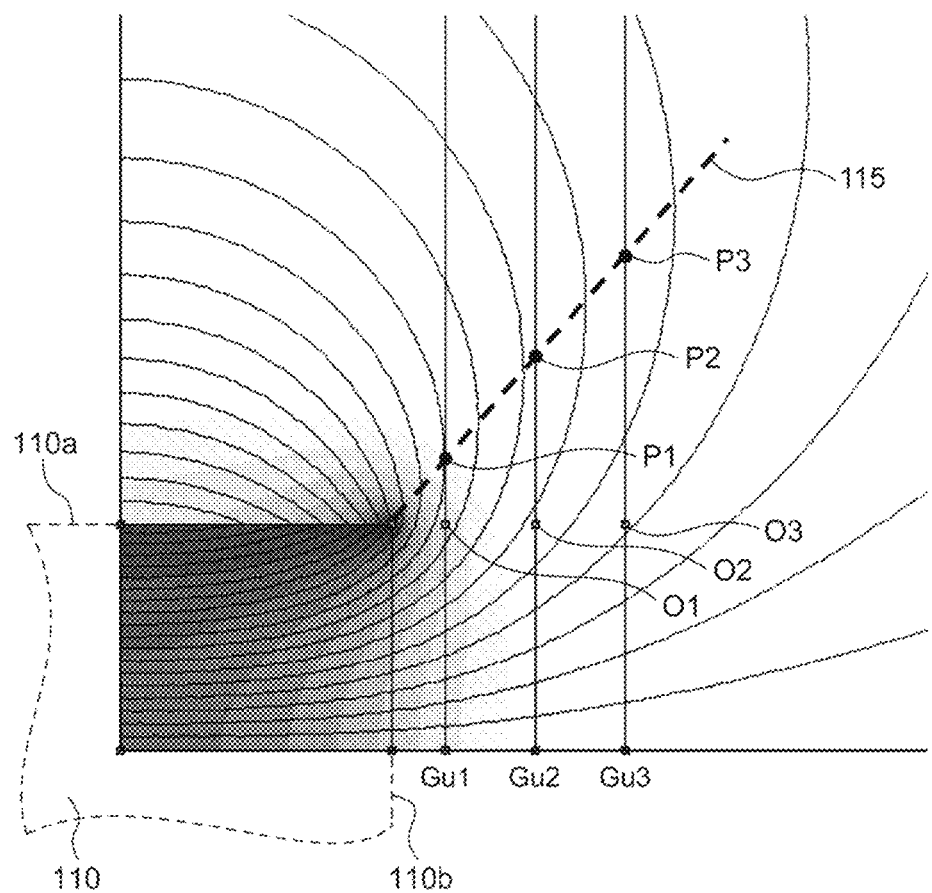
FIGS. 7A and 7B are graphs showing calculation results of a magnetic field generated in a magnetic regenerator material due to magnetization of the magnetic regenerator material by an external magnetic field.
Figure 7B:
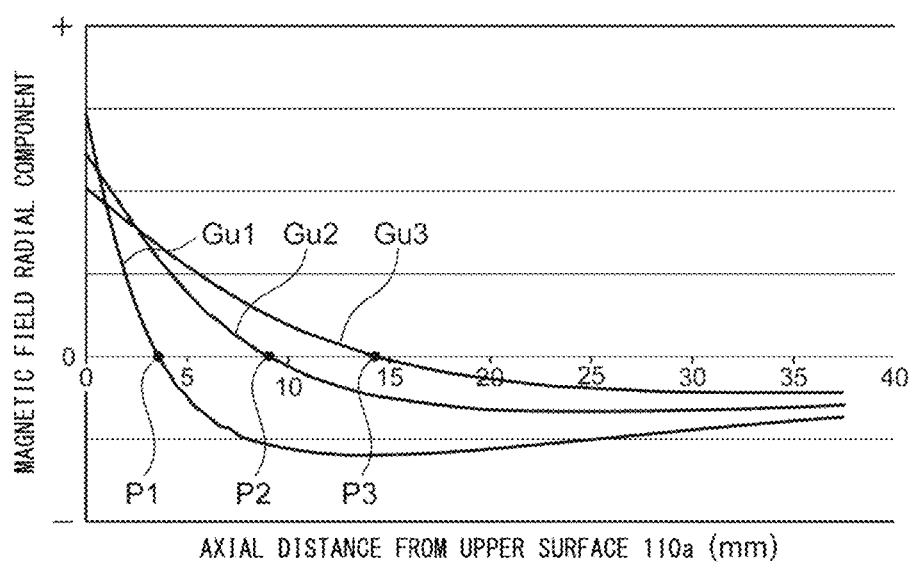

FIGS. 7A and 7B are graphs showing calculation results of a magnetic field generated in a magnetic regenerator material due to magnetization of the magnetic regenerator material by the external magnetic field. In FIG. 7A, an upper right half of the magnetic regenerator material 110 and a magnetic field are shown. In FIG. 7A, a direction of the magnetic field is indicated by a curve, and a strength of the magnetic field is indicated by shading. The closer the curve is horizontal, the larger a radial component of the magnetic field at that position. FIG. 7B shows a relationship between radial magnetic field components at three radial distances Gu1, Gu2, and Gu3 shown in FIG. 7A and a distance from the upper surface 110a of the magnetic regenerator material 110. In the radial distances Gu1, Gu2, and Gu3, Gu1 is closest to the side surface 110b of the magnetic regenerator material 110, and Gu3 is furthest from the side surface 110b of the magnetic regenerator material 110. In this calculation example, the radial distances Gu1, Gu2, and Gu3 are 3 mm, 8 mm, and 13 mm. In FIG. 7B, a radially outward direction is positive and a radially inward direction is negative.

As understood from FIGS. 7A and 7B, at the same axial position (points O1, O2, and O3 shown in FIG. 7A and original points in FIG. 7B) as the upper surface 110a of the magnetic regenerator material 110, the magnetic field has a radially outward component in any of the radial distances Gu1, Gu2, and Gu3.

The radially outward component of the magnetic field becomes weaker as the axial height from the upper surface 110a of the magnetic regenerator material 110 increases. For example, in the radial distance Gu1, the radially outward component of the magnetic field weakens upward from the upper surface 110a of the magnetic regenerator material 110 and becomes zero at a position P1. The magnetic field is directed radially inward above the position P1. In the radial distances Gu2 and Gu3, the magnetic field is similarly changed upward from the upper surface 110a of the magnetic regenerator material 110. However, in the radial distance Gu2, a position P2 where the radially outward component of the magnetic field becomes zero is above the position P1, and in the radial distance Gu3, a position P3 where the radially outward component of the magnetic field becomes zero is above the position P2. As shown in FIG. 7A, the positions P1, P2, and P3 are substantially aligned on a straight line 115 extending obliquely upward from a right end of the upper surface of the magnetic regenerator material 110.

In a case where the magnetic field has the radially outward component, it means that the magnetic field goes outward radially from a center axis of the cryocooler, and thus, it is desirable to be shielded by the magnetic shield 70. Therefore, indications of the axial extra length LSS of the magnetic shield 70 are determined by the positions P1, P2, P3 where the radially outward component of the magnetic field becomes zero, that is, the straight line 115. By setting the axial extra length LSu of the magnetic shield 70 to the positions P1, P2, P3, the leakage of the magnetic field from the upper surface 110a of the magnetic regenerator material 110 and from the vicinity of the upper surface 110a can effectively be prevented.

FIG. 8 is a table showing the radial distances Gu1, Gu2, and Gu3 and the axial extra length LSu of the magnetic shield 70 in the examples of FIGS. 7A and 7B. The axial extra length LSu (that is, positions P1, P2, and P3) of the magnetic shield 70 corresponding to each of the radial distances Gu1, Gu2, and Gu3 is 3.6 mm, 9 mm, and 14.3 mm.

FIG. 8 shows a ratio (LSu/Gu) of the axial extra length LSu with respect to the radial distance Gu. Hereinafter, LSu/Gu is referred to as an extension length parameter of the magnetic shield 70. Specifically, the extension length parameters LSu/Gu at the positions P1, P2, and P3 are 1.2, 1.125, and 1.1.

According to consideration of the present inventors based on these results, preferably, the magnetic shield 70 satisfies LSu/Gu≥1. In this case, the magnetic shield 70 satisfies LSu≥Gu. Accordingly, both shielding of the magnetic noise and suppression of an excessive increase in weight of the magnetic shield 70 can be achieved.

FIG. 9 is a graph showing a relationship between the extension length parameter LSu/Gu of the magnetic shield 70 and the shield performance index B/B0, and is obtained by analysis of the present inventors. As described above, the magnetic noise shielding effect of the magnetic shield 70 increases as the value of the shield performance index B/B0 decreases. The shield performance index B/B0 shown in FIG. 9 is a value at a certain representative point outside the magnetic shield 70.

As shown in FIG. 9, the shield performance index B/B0 decreases as the extension length parameter increases, and thus, performance of the magnetic shield 70 increases. While the shield performance index B/B0 is approximately 0.21 in a case where the extension length parameter LSu/Gu is zero (that is, in a case where the axial extra length LSu of the magnetic shield 70 is zero), the shield performance index B/B0 is improved to approximately 0.15 in a case where the extra length parameter LSu/Gu is 1. If the extension length parameter LSu/Gu increases to 2, the shield performance index B/B0 is further improved to approximately 0.1.

Also from this analysis result, it is understood that the magnetic shield 70 preferably satisfies LSu/Gu≥1. More preferably, the magnetic shield 70 may satisfy LSu/Gu≥2. Even in a case where the magnetic shield 70 satisfies LSu/Gu≥0.5, good performance can be obtained as compared with the case where the axial extra length LSu is zero.

If the extension length parameter LSu/Gu exceeds 2, a decrease in the shield performance index B/B0 is smaller. For example, when extension length parameter LSu/Gu is in the range of 3 to 5, the shield performance index B/B0 is approximately 0.09 to 0.08, which is almost constant. If the extension length parameter LSu/Gu becomes excessively large, as described above, disadvantages arise due to the increase in the weight of the magnetic shield 70. Therefore, for example, the extension length parameter LSu/Gu may be less than 3 or less than 2.

The upper limit of the axial extra length LSu of the magnetic shield 70 can also be determined from another viewpoint. For example, the axial upper end 71 of the magnetic shield 70 may be axially separated from the first-stage cooling stage 35 axially below the first-stage cooling stage 35 (refer to FIG. 1). In this way, a thermal contact between the magnetic shield 70 and the first-stage cooling section 15 can be avoided. In order to more reliably avoid the thermal contact, the axial upper end 71 of the magnetic shield 70 may be axially separated from the first-stage cooling stage 35 by 0.1 mm to 10 mm (for example 2 mm to 8 mm, or approximately 5 mm).

Similarly, optimization of a length of the axial lower end 73 of the magnetic shield 70 can be realized. In another embodiment, as shown in FIG. 10, the axial lower end 73 of the magnetic shield 70 may extend further axially downward from a lower surface 110c of the magnetic regenerator material 110 when the displacer 100 is positioned at the bottom dead center.

When an axial extra length of the magnetic shield 70 from the lower surface 110c of the magnetic regenerator material 110 when the displacer 100 is positioned at the bottom dead center is expressed by LS1 and a radial distance from the lower surface 110c of the magnetic regenerator material 110 to the magnetic shield 70 when the displacer 100 is positioned at the bottom dead center is expressed by G1, the magnetic shield 70 may satisfy LS1≥G1 (in general, Gu=G1).

In addition, considering a relationship between an extension length parameter LS1/G1 and the shield performance index B/B0, the magnetic shield 70 may satisfy LS1/G1≥2. In addition, the magnetic shield 70 may satisfy LS1/G1≥0.5. The magnetic shield 70 may satisfy 3>LS1/G1 or 2>LS1/G1.

As an example, the axial lower end 73 of the magnetic shield 70 may extend downward by a length of approximately 20 mm or less from a lower end of the movement range of the magnetic regenerator material 110 moved by the axial reciprocation of the displacer 100.

In addition, as shown in FIG. 5A, the axial lower end 73 of the magnetic shield 70 may be joined to the second-stage cooling stage 72. Alternatively, as shown in FIG. 5B, the axial lower end 73 of the magnetic shield 70 may be integrally formed with the second-stage cooling stage 72. As shown in the drawings, the axial lower end 73 of the magnetic shield 70 may be positioned at an axial position different from that of a lower surface 72a of the second-stage cooling stage 72, for example, may be positioned slightly above the lower surface 72a of the second-stage cooling stage 72. Alternatively, as shown in FIG. 1, the axial lower end 73 of the magnetic shield 70 may be positioned at the same axial position as that of the lower surface 72a of the second-stage cooling stage 72.

Figure 11:
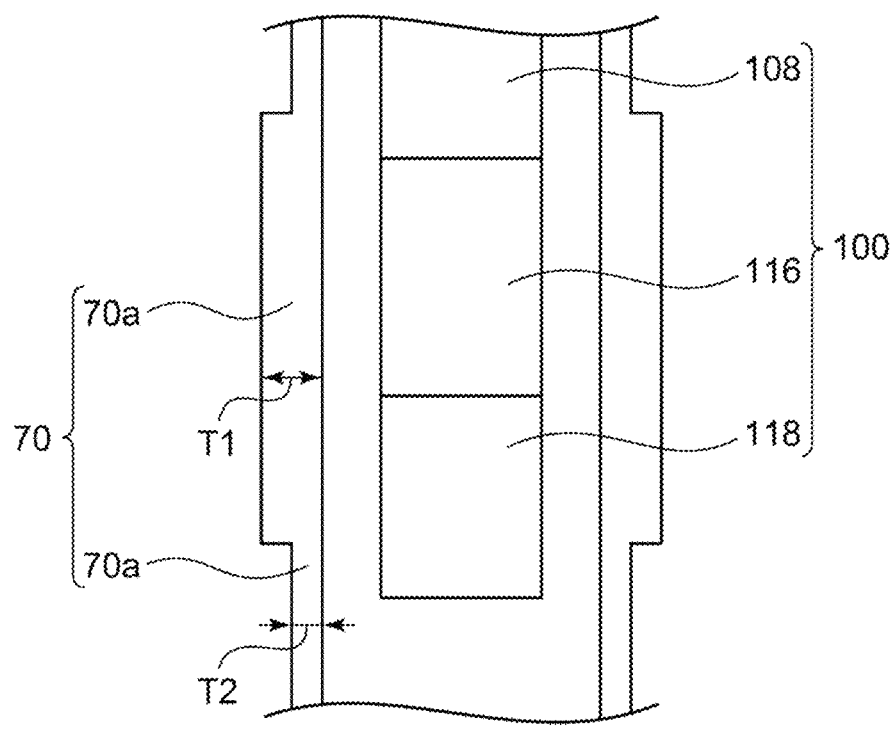
FIG. 11 is a schematic diagram partially showing the magnetic shield and the displacer according to still another embodiment.

In addition, in still another embodiment, as shown in FIG. 11, the displacer 100 may include a plurality of kinds of magnetic regenerator materials in addition to the non-magnetic regenerator material 108. As an example, the first magnetic regenerator material 116 is $HoCu_2$, and the second magnetic regenerator material 118 is $Gd_2O_2S$ (referred to as GOS). The first magnetic regenerator material 116 and the second magnetic regenerator material 118 are disposed at different positions from each other in the axial direction. For example, the first magnetic regenerator material 116 is adjacent axially above the second magnetic regenerator material 118. The non-magnetic regenerator material 108 is adjacent axially above the first magnetic regenerator material 116. However, the magnetic regenerator material 110 which can be used for displacer 100 is not limited to the specific materials exemplified here. The displacer 100 may have three or more kinds of magnetic regenerator materials.

The first magnetic regenerator material 116 and the second magnetic regenerator material 118 are magnetized by the external magnetic field Be, respectively. Here, it is assumed that the first magnetic regenerator material 116 is a magnetic regenerator material having the largest magnetization among the plurality of kinds of magnetic regenerator materials, a first magnetization amount of the first magnetic regenerator material 116 caused by the external magnetic field Be is expressed by $M_{max}$, and a second magnetization amount of the second magnetic regenerator material 118 caused by the external magnetic field Be is expressed by $M_2$. The first magnetization amount $M_{max}$ of the first magnetic regenerator material 116 is larger than the second magnetization amount $M_2$ of the second magnetic regenerator material 118.

Figure 12:
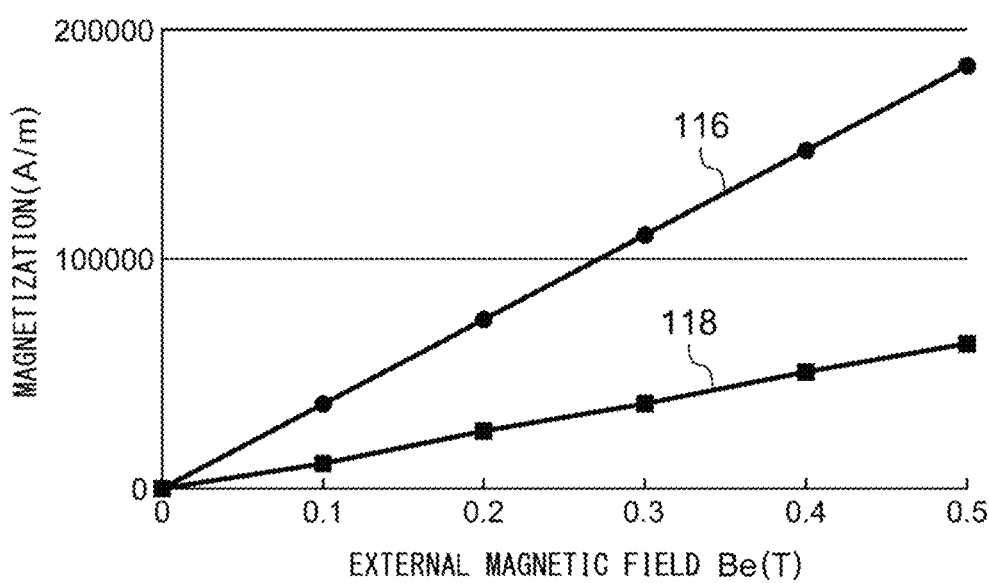
FIG. 12 shows a magnetization curve of an exemplary magnetic regenerator material.

FIG. 12 shows a magnetization curve in a cryogenic temperature range (5 K) of the first magnetic regenerator material 116 (that is, $HoCu_2$) and the second magnetic regenerator material 118 (that is, GOS). As shown in FIG. 12, the magnetization of the first magnetic regenerator material 116 generated by the external magnetic field Be is larger than that of the second magnetic regenerator material 118 generated by the external magnetic field Be.

As the magnetization decreases, the magnetic field emitted from the magnetic regenerator material decreases. Accordingly, in a case where the magnetic shield 70 has sufficient magnetic noise shielding performance with respect to the first magnetic regenerator material 116, the magnetic shield 70 has excessive performance with respect to the second magnetic regenerator material 118.

Accordingly, the magnetic shield 70 includes a first shield portion 70a which surround the first magnetic regenerator material 116 and a second shield portion which surrounds the second magnetic regenerator material 118. A thickness T2 of the second shield portion 70b may be thinner than a thickness T1 of the first shield portion 70a. The first shield portion 70a and the second shield portion 70b may be formed of the same material as each other. In this way, it is possible to reduce a weight of the second shield portion 70b.

In general, compared the above-described magnetic shield parameter ($\sigma \cdot t$) of the first shield portion 70a, the magnetic shield parameter ($\sigma \cdot t$) of the second shield portion 70b can be somewhat decreased. In an embodiment, when the magnetic shield parameter of the first shield portion 70a is expressed by $(\sigma \cdot t)_{max}$ and the magnetic shield parameter for the second shield portion 70b is expressed by $(\sigma \cdot t)_2$, the magnetic shield 70 may satisfy $M_2/M_{max} \cdot (\sigma \cdot t)_{max} \leq (\sigma \cdot t)_2 < (\sigma \cdot t)_{max}$. That is, the magnetic shield parameter $(\sigma \cdot t)_2$ of the second shield portion 70b may be decreased to a value obtained by multiplying the magnetic shield parameter $(\sigma \cdot t)_{max}$ of the first shield portion 70a by a coefficient $M_2/M_{max}$ (since $M_2 < M_{max}$, $M_2/M_{max} < 1$). In this way, both shielding of the magnetic noise and a decrease in the weight of the second shield portion 70b can be achieved.

Preferably, the magnetic shield j70 may satisfy $M_2/M_{max} \cdot (\sigma \cdot t)_{max} = (\sigma \cdot t)_2$. In this way, the weight of the second shield portion 70b can be lightest while the shield performance of the magnetic noise is maintained.

In addition, the magnetic shield 70 may satisfy $(\sigma \cdot t)_2 = (\sigma \cdot t)_{max}$. Accordingly, the shielding performance of the magnetic noise of the second shield portion 70b can be designed to be equal to that of the first shield portion 70a. For example, the first shield portion 70a and the second shield portion 70b can be formed of the same material with the same thickness, and the magnetic shield 70 is easily manufactured.

In summary, the magnetic shield 70 may satisfy $M_2/M_{max} \cdot (\sigma \cdot t)_{max} \leq (\sigma \cdot t)_2 \leq (\sigma \cdot t)_{max}$.

A case where the displacer 100 includes a third magnetic regenerator material and the magnetic shield 70 includes a third shield portion which surrounds the third magnetic regenerator material is similar. If the magnetic shield parameter of the third shield portion is expressed by $(\sigma \cdot t)_3$, the magnetic shield 70 satisfies $M_3/M_{max} \cdot (\sigma \cdot t)_{max} \leq (\sigma \cdot t)_3 \leq (\sigma \cdot t)_{max}$. Here, it is assumed that third magnetization $M_3$ smaller than the first magnetization $M_{max}$ is generated in the third magnetic regenerator material by the external magnetic field Be.

The first shield portion 70a may extend over the entire movement range of the first magnetic regenerator material 116 moved by the reciprocation of the displacer 100. For example, the first shield portion 70a may extend upward by a length of approximately 20 mm or less from an upper end of the movement range of the first magnetic regenerator material 116. The first shield portion 70a may extend upward by a length of approximately 20 mm or less from a lower end of the movement range of the first magnetic regenerator material 116.

Hereinbefore, embodiments of the present invention are described. It should be understood that the invention is not limited to the above-described embodiment, but may be modified into various forms on the basis of the spirit of the invention. Additionally, the modifications are included in the scope of the invention.

According to an embodiment, a cooling stage structure or a hermetic container structure of a cryocooler is provided. The cooling stage structure or the hermetic container structure includes a cooling stage, a cylinder which is provided on a terminal of the cooling stage, and a tubular magnetic shield which is installed on the cooling stage and extends along the cylinder outside the cylinder. The tubular magnetic shield is formed of a normal conductor and a product of an electrical conductivity in a temperature range of 10 K or less and a thickness of the tubular magnetic shield is 60 MS (Mega-Siemens) to 1980 MS. The tubular magnetic shield may be directly installed on the second-stage cooling stage of the cryocooler, and an inner diameter of the tubular magnetic shield may be smaller than an outer diameter of the first-stage cooling stage of the cryocooler.

According to an embodiment, a magnetic shield component of a cryocooler is provided. The magnetic shield component includes a cooling stage and a tubular magnetic shield which is directly installed on the cooling stage. The tubular magnetic shield is formed of a normal conductor and a product of an electrical conductivity in a temperature range of 10 K or less and a thickness of the tubular magnetic shield is 60 MS (Mega-Siemens) to 1980 MS. The tubular magnetic shield may be directly installed on the second-stage cooling stage of the cryocooler, and an inner diameter of the tubular magnetic shield may be smaller than an outer diameter of the first-stage cooling stage of the cryocooler.

What is claimed is:

1. A cryocooler comprising:
   a cooling stage cooled to a cryogenic temperature around or below 4.2 K;
   a cylinder which includes the cooling stage on a terminal of the cylinder;

a displacer which includes a magnetic regenerator material and is accommodated in the cylinder so as to be able to reciprocate in the cylinder; and a tubular magnetic shield which is installed on the cooling stage and extends along the cylinder outside of the cylinder, wherein the tubular magnetic shield is formed of a normal conductor and a product of an electrical conductivity in a temperature range of 10 K (Kelvin) or less and a thickness of the tubular magnetic shield is formed to have a conductance of 60 MS (Mega-Siemens) to 1980 MS, wherein the tubular magnetic shield is formed of pure copper and cooled to the cryogenic temperature around or below 4.2 K.

2. The cryocooler according to claim 1, wherein in the tubular magnetic shield, the product of the electrical conductivity in the temperature range of 10 K or less and the thickness of the tubular magnetic shield is formed to have a conductance of 89 MS to 1980 MS.

3. The cryocooler according to claim 1, wherein in the tubular magnetic shield, the product of the electrical conductivity in the temperature range of 10 K or less and the thickness of the tubular magnetic shield is formed to have a conductance of 60 MS to 1000 MS.

4. The cryocooler according to claim 1, wherein the tubular magnetic shield extends over an entire movement range of the magnetic regenerator material moved by reciprocation of the displacer.

5. The cryocooler according to claim 4, wherein the tubular magnetic shield further extends upward in an axial direction from an upper surface of the magnetic regenerator material when the displacer is positioned at a top dead center, and wherein the tubular magnetic shield satisfies $LSu \geq Gu$ when an axial extra length of the tubular magnetic shield from the upper surface of the magnetic regenerator material when the displacer is positioned at the top dead center is expressed by $LSu$ and a radial distance from the upper surface of the magnetic regenerator material to the tubular magnetic shield when the displacer is positioned at the top dead center is expressed by $Gu$.

6. The cryocooler according to claim 1, wherein the tubular magnetic shield is brazed to the cooling stage.

7. The cryocooler according to claim 1, wherein the tubular magnetic shield is integrally formed with the cooling stage.

8. The cryocooler according to claim 1, wherein the cooling stage is a second-stage cooling stage of the cryocooler.

9. The cryocooler according to claim 8, further comprising:

a first-stage cooling stage of the cryocooler, wherein the tubular magnetic shield is directly installed on the second-stage cooling stage, and an inner diameter of the tubular magnetic shield is smaller than an outer diameter of the first-stage cooling stage of the cryocooler.

10. A tubular magnetic shield which is directly installed on a cooling stage of a cryocooler, wherein the cooling stage cooled to a cryogenic temperature around or below 4.2 K, wherein the magnetic shield is formed of a normal conductor and a product of an electrical conductivity in a temperature range of 10 K (Kelvin) or less and a thickness of the tubular magnetic shield is formed to have a conductance of 60 MS (Mega-Siemens) to 1980 MS, wherein the tubular magnetic shield is formed of pure copper and cooled to the cryogenic temperature around or below 4.2 K.

11. The cryocooler according to claim 1, wherein the pure copper forming the tubular magnetic shield has a residual resistance ratio in a range of 300 to 1000.

* * * * *